(12) United States Patent
Pasotti et al.

(10) Patent No.: US 6,314,043 B1
(45) Date of Patent: Nov. 6, 2001

(54) ERASING AND PARALLEL REWRITING CIRCUIT FOR MEMORY CELL BLOCKS, PARTICULARLY FOR ANALOG FLASH CELLS, AND RELATED OPERATING METHOD

(75) Inventors: Marco Pasotti, S. Martino Siccomario; Giovanni Guaitini, Trecella; Pier Luigi Rolandi, Monleale, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/592,796

(22) Filed: Jun. 13, 2000

(30) Foreign Application Priority Data

Jun. 21, 1999 (EP) ................................................ 99830381

(51) Int. Cl.[7] ...................................................... G11C 8/00
(52) U.S. Cl. ................................ 365/230.03; 365/230.06; 365/189.04; 365/185.29
(58) Field of Search ........................ 365/230.03, 230.06, 365/189.04, 185.29

(56) References Cited

U.S. PATENT DOCUMENTS

| | | | |
|---|---|---|---|
| 5,748,528 | 5/1998 | Campardo et al. | 365/185.13 |
| 5,761,702 | 6/1998 | Matsufuji | 711/103 |
| 5,946,260 | * 9/1999 | Manning | 365/230.03 |
| 5,956,274 | * 9/1999 | Elliott et al. | 365/189.04 |

* cited by examiner

*Primary Examiner*—David Nelms
*Assistant Examiner*—Connie C. Yoha
(74) *Attorney, Agent, or Firm*—Wolf, Greenfield & Sacks, P.C.; James H. Morris; Theodore E. Galanthay

(57) ABSTRACT

Circuit for erasing and rewriting blocks of memory cells and particularly of analog flash cells, including at least one row decoding circuit including at least two adder blocks, suitable to generate a row address signal, at least two decoder blocks, suitable to generate respective pluralities of signals identifying a respective sector of memory to be enabled, at least two shifter blocks, suitable to generate an address signal of another row to be enabled, at least two OR logic blocks, suitable to generate respective signals serving the purpose to simultaneously enable at least two rows of the memory matrix.

19 Claims, 4 Drawing Sheets

ERASING AND PARALLEL REWRITING CIRCUIT FOR MEMORY CELL BLOCKS, PARTICULARLY FOR ANALOG FLASH CELLS, AND RELATED OPERATING METHOD

BACKGROUND OF THE INVENTION

1. Field of the Invention

The present invention concerns a circuit for parallel erasing and rewriting of blocks of memory cells and particularly for analog flash cells, and related operating method.

2. Discussion of the Related Art

The bits in a memory matrix can be addressed both individually and in blocks. If, for instance, a bit in a memory of 4M bits is addressed, 22 bits of address will be necessary, being $2^{22}=4194304$. Otherwise, if one addresses by byte, that is 8 bits at a time, it will be necessary to have 19 as address.

The memory matrix is made up of floating gate cells in which the bits are stored. By injecting a certain charge in the floating gate, during the programming operation, it is possible to increase the value of the threshold voltage of the cell in a permanent way. The threshold voltage of the cell corresponds to a certain logic level, and in this way by rereading the value of said voltage with suitable circuits, called "sense amplifiers", it is possible to determine which bit or bits are stored in the cell.

In fact, each memory cell is capable of storing one or more bits, according to whether the threshold has been programmed on two or more levels, respectively. For instance 16 levels correspond to 4 bits for each cell.

Finally the cells can be erased electrically by extracting the charges trapped in the floating gate.

The writing of a datum in a cell presupposes that said cell is virgin or erased, that is it has a low threshold level.

In some applications the minimum unit of transfer is 512 bytes. In these cases, if even one cell of a block to be programmed has been previously programmed, it is necessary to apply the erasing algorithm to the entire block and subsequently to carry out the programming operation. The specifications on writing times also include the time necessary to carry out the erasing operation, thus imposing very strict limitations both on the programming times and on the erasing times.

The programming, or writing, operation involves one or more cells belonging to the same row and said operation can be executed by applying positive voltage pulses, for instance pulses having a step shaped wave, on the row, that is on the gate electrodes of each cell, and a voltage, either continuous or pulsed, on the drain electrode of each cell to be programmed, while putting the source electrode of each cell at ground and the bulk electrode of each cell at ground or at a negative voltage.

The situation that is thus created, during the programming operation, is therefore the following: the gate electrodes of the row to be programmed have a positive voltage, for instance +5V, while all the other rows are at ground, the source electrodes are at ground, the bulk electrodes are at ground or have a negative voltage, for instance -5V, the drain electrodes of the column to be programmed are +5V while the other columns are floating.

The flash memory, because of the way it is conceived, does not allow the erasing of the single cell, since in order to increase the cell density and therefore to increase the density of recordable data, it is made in a such way that the source and bulk terminals of the single cells are common. With the current state of the art, the matrix of the flash memory is divided into sectors, each one erasable independently from the others.

The erasing operation in the flash memories consists in extracting all the charges trapped in the floating gate of each cell by application of one or more erasing pulses.

After the erasing operation, in order to allow a correct data storing operation, particularly if the memory is of multilevel type, it is necessary, in first place, not to let any cell go into depletion (too low threshold) and, in second place, that at the end of the process all cells have a threshold voltage lower than a certain value. In addition, at the end of the process all the thresholds of the cells to be erased must be within a well established and not too wide interval of values.

In a previous Italian patent application No. MI99A00859 filed on Apr. 23, 1999 a method that allows relaxation of the conditions to perform the erasing operation was described. In said method the cells of the memory sector taken into consideration must meet less strict conditions in terms of writing and erasing times, since the new data to be written in the same sector are used as references for each cell. These techniques allow decreasing the average time of the erasing operation.

The erasing operation of a row of a sector of the memory matrix, according to such method, is done by setting a negative voltage on the gate line of the row that must be erased, a positive voltage on the bulk and/or source electrodes of the sector and a positive voltage on the gates of the other rows of the sector, while leaving the drain electrodes, which represent the columns of the memory sector, floating.

The situation that is thus created during the erasing operation is therefore the following: the gate electrodes of the row to be erased are negative, for instance -8V, while those of the remaining rows of the block are positive, for instance +8V, the drain electrodes are floating, the bulk electrodes have a positive voltage, for instance +8V and the source electrodes have a voltage of +8V or they are floating.

In the traditional methods, in which the erasing operation involves more rows simultaneously, it can occur that during said operation one or more cells undergo depletion. This must be prevented since it would cause a reading error for all cells of that column. Besides, the cell undergoing depletion, according to the traditional method, would not be detectable among the other ones of the same column, and therefore it could not be retrieved by means of proper programming pulses.

In the method according to the application previously referred to a possible depleted cell is instead always detectable and therefore retrievable during the writing or programming operation.

This implies that instead of applying programming pulses alternated to erasing ones, in order to prevent overerasing, that is to prevent that a cell undergoes depletion, only the erasing pulse for a pre-established time is applied. This allows, in addition to an increase in the speed of the programming and writing operations, a simpler control of the memory.

The erasing operation concerns, therefore, a single row that includes a certain number of columns. This means that only a certain number of the addressing bits is necessary in order to specify which block must be erased, while the other bits, that is the ones that select the column, are as a result uninfluential.

It must be finally noticed that, when a programming operation of a memory is carried out, it often happens that several blocks must be programmed, whose minimum unit is of 512 B (byte).

In view of the state of the art above described an object of the present invention is to provide for a circuit and a method for parallel erasing and rewriting of blocks of analog flash cells and related operating method.

SUMMARY OF THE INVENTION

According to the present invention, this and other objects are achieved by means of a circuit for erasing and rewriting blocks of memory cells and particularly of analog flash cells, comprising at least one row decoding circuit, comprising at least two adder blocks, that are suitable to generate a row address signal, at least two decoder blocks, that are suitable to generate respective pluralities of signals identifying a respective sector of memory to be enabled, at least two shifter blocks, that are suitable to generate an address signal of another row to be enabled, at least two OR logic blocks, that are suitable to generate respective signals serving the purpose to enable simultaneously at least two rows of the memory matrix.

Owing to the present invention a circuit for parallel erasing and rewriting blocks of analog flash cells is provided through which the row and column decoding signals are controlled in such a way that it is possible to carry out a chain, that is a pipeline, operation so that the programming of an already erased block while another block is subjected to the erasing operation is possible.

BRIEF DESCRIPTION OF THE DRAWINGS

The characteristics and the advantages of the present invention will become evident from the following detailed description of an embodiment thereof, that is illustrated as a non limiting example in the enclosed drawings, in which.

DETAILED DESCRIPTION

Figure 1:
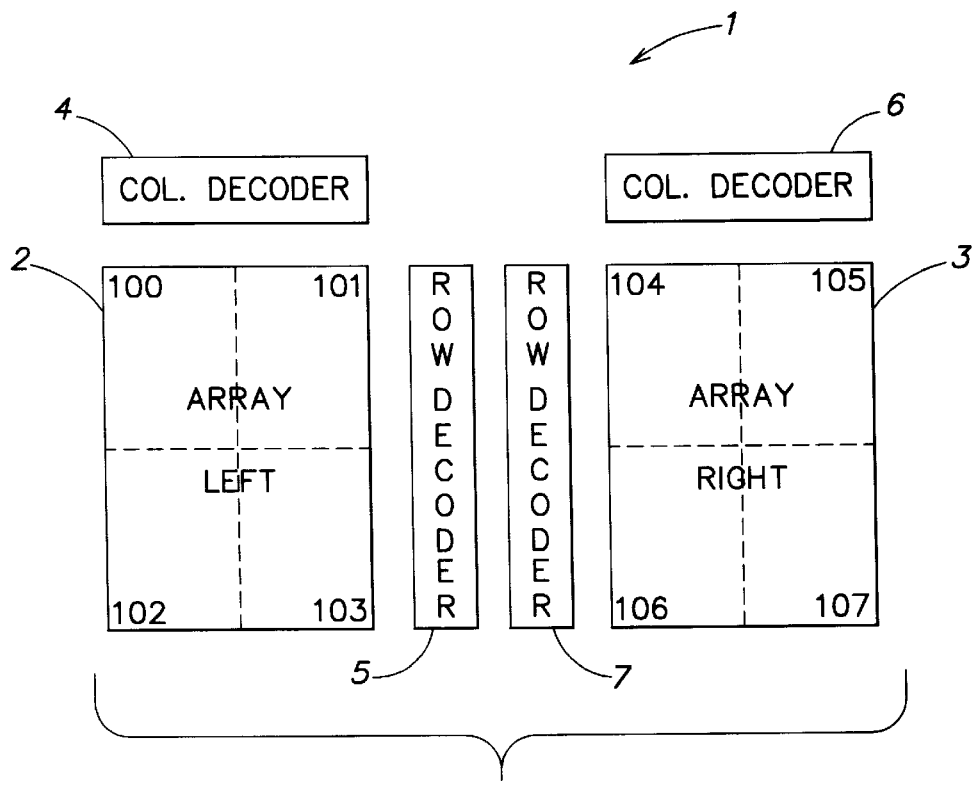
FIG. 1 shows a typical embodiment of a memory, particularly of a flash memory, according to the known art.

In FIG. 1 there is shown a schematic embodiment of a memory, particularly of a flash memory, according to the known art.

According to that illustrated in such figure, there is indicated with 1, in its complex, a matrix of memory cells, which adopts a square organisation so as to reduce or minimize the occupied space. The matrix 1 is divided into a portion or sub-matrix, on the left side 2, and into a portion or sub-matrix on the right 3. Said portions are in turn divided into blocks, or subsectors, that are physically separated from one another, by means of triple-wells, so that the cells of each sub-sector of a sub-matrix have a common source and bulk route which is different from the one of the cells of every other sub-sector. For instance the sub-matrix 2 is divided into 4 blocks 100, 101, 102 and 103 and the sub-matrix 3 is also divided into 4 blocks 104, 105, 106 and 107.

In addition it can be noticed that the rows and the columns of these two sub-matrixes are selected by an independent circuit, 4–5 for the sub-matrix 2 and 6–7 for the sub-matrix 3. The block 4 is a column decoder while the block 5 is a row decoder, and the same also for the blocks 6–7, respectively. The function of said blocks is to allow the execution of operations of erasing, programming and reading of a single cell located inside the two sub-matrixes 2–3. The selection of the single memory cell is carried out by an input/output circuitry (not present in figure) to which the row and column addresses are coupled.

Normally the sub-matrixes 2–3 act in an exactly identical manner under the action of a signal (not present in figure) that enables one of the two sub-matrixes.

The matrix of memory cells 1, as a result of its structure, guarantees a certain degree of independence in the signals that can be applied to its various parts.

Figure 2:
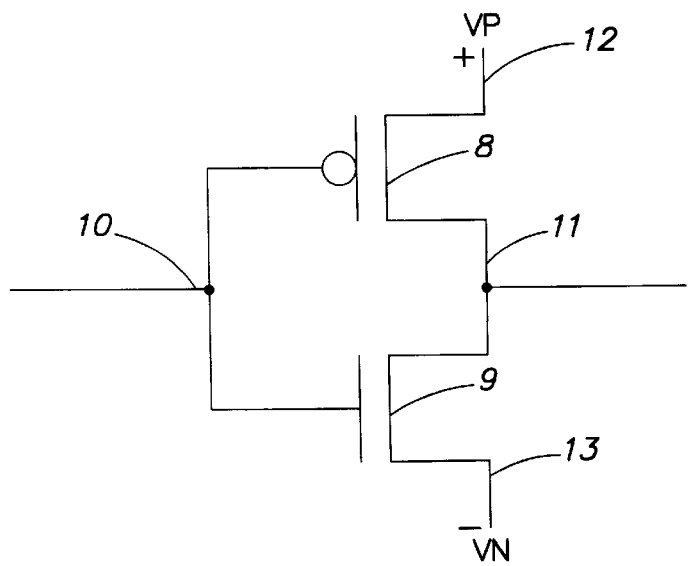
FIG. 2 illustrates an inverter circuit according to the known art.

The row decoders 5 and 7, depending on the value of the addressing bits, activate a series of high voltage inverters, as shown in detail further on with reference to FIG. 2, that, at the end of said decoding operation, set a certain voltage value on the selected row and another voltage value on the rows that are not being selected.

In FIG. 2 there is shown a circuit inverter, according to the known art.

According to that illustrated in such figure it is possible to notice that the circuit is made up of two CMOS technology transistors. The pull-up transistor is made by a p-channel 8, while the pull-down transistor by a n-channel 9. The gate electrode of the two transistors is in common and creates the input terminal of the voltage 10.

The drain electrode of the two transistors is in common and creates the output terminal of the voltage 11.

The source electrode of the p-channel 12 is connected to a positive supply line.

The source electrode of the n-channel 13 is connected to a negative supply line.

The function of the single inverter, during row decoding operation, is to connect the output node 11, that is the gate electrode, of the row selected by the addressing bits, to its positive or negative supply.

In order to reduce the complexity of the system, having specified that each row has its own high voltage inverter, said inverters are preceded by a tree scheme system of selection in a such way that some of the circuits of selection are sharable, as described in detail later with reference to FIG. 3.

Similar tree-like selection circuits are provided in order to carry out the column decoding operation. In case of programming and reading, all the columns that are not being selected are left floating, while the one or the ones being selected are connected to the appropriate nodes. More precisely, only the portion of the selected columns, belonging to the sector of interest, is connected to the respective global lines, through local switches. In case of erasing, all the columns are left floating.

Therefore during an erasing operation, for instance, only one row of a sector of a sub-matrix is affected, which is detected by a subset of the address bits, while the remaining bits, that is the ones selecting the column, are as a result uninfluential.

In addition other circuits (not present in figure) provide the proper voltages on the source and bulk electrodes so as to execute the erasing, programming and reading operations.

Figure 3:
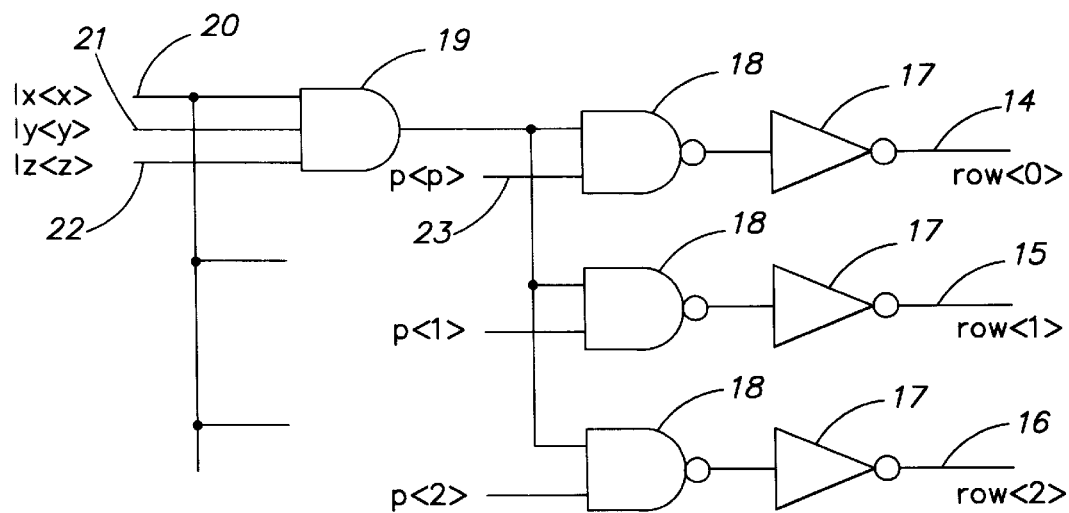
FIG. 3 shows a row selection scheme according to the known art.

In FIG. 3 there is illustrated a row decoding scheme, according to the known art.

According to that illustrated in such figure, a series of logic gates, or combinational circuits of NOT, NAND and AND type, can be observed that are connected according to a tree scheme, in which the root is represented by the addressing bit line 14, 15 and 16 of the rows of a sub-matrix 3 or 4.

The logic gate NOT 17 is made up of an inverter of the type of FIG. 2, characterized by the property of having a high voltage output when the input is at a low voltage and vice versa, therefore the term NOT derives from the fact that the output is the complement or negation of the input.

The logic gate NAND 18 is characterized by the property that the voltage of output is at a low state when both the terminals of input have a high voltage.

The logic gate AND 19 is characterized by the property that the output voltage is at a high state when all the input terminals have a high voltage.

In addition it is possible to notice a plurality of signal lines 20, 21, 22, 23 respectively called Ix<x>, Iy<y>, Iz<z>, and p<p>, where x, y, z and p are generic indexes which identify the row that it is intended to be selected. Said signals are enunciated in order of hierarchical precedence, that is the signal with highest degree is Ix<x>.

The addressing rows 14, 15 and 16 are selected through the high voltage logic gates, 17, 18 and 19, depending on the voltage values present on the lines 20, 21, 22 and 23.

If one considers for instance the row 14, this is selected when all the lines Ix, Iy, Iz and p have high voltage.

In fact, if Ix<x>Iy<y> and Iz<z> and p<p>, have a high voltage at the output of the logic gate 19, the resulting voltage will also be high. If in addition the p line has a high voltage too, the output of the logic gate 18 will have a low voltage. This voltage is inverted by the logic gate 17 in such a way that on the line 14 there is a high voltage, that is said row thus is activated.

While Ix<x> enables a certain number of logic gates, the line Iy<y> enables only some of these logic gates enabled by Ix<x> and the line Iz<z> enables a subset of logic gates enabled by Iy<y> up to the line p<p> that enables a single row. Therefore some of the circuits are shared on more cells.

In a similar way one also proceeds for the selection of the other rows 15 and 16, rows that belong to one of the two sub-matrixes 2 or 3.

Therefore, according to the value of the addressing bits, through a plurality of logic gates controlled by more signal lines, the row decoding operation enables a series of high voltage inverters, that set, at the end of said decoding operation, a certain voltage value on the selected row and another voltage value on the rows that are not being selected.

Figure 4:
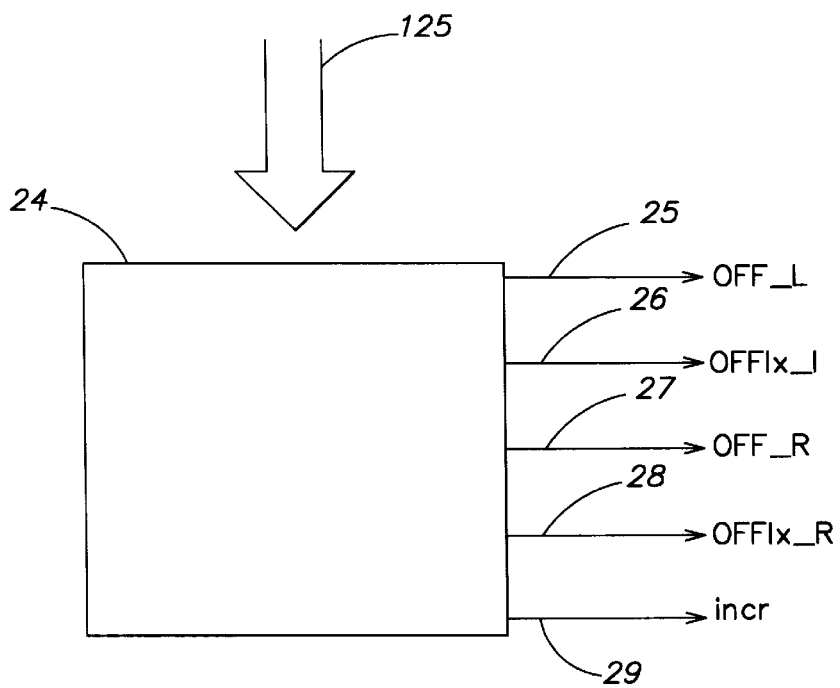
FIG. 4 shows the scheme of a microcontroller according to the known art.

In FIG. 4 there is shown a block diagram of a microcontroller.

According to that illustrated in such figure one observes that the microcontroller 24 is programmed on the bases of the characteristics of the data flow 125.

The microcontroller 24 generates a plurality of control signals and among these it is possible to notice the signals OFF_L 25, OFF1x_1 26, OFF_R 27, OFF1x_r 28 and incr 29. Said signals represent the values of shift that the row addresses must effect as per what will be subsequently explained in detail with reference to FIGS. 5 and 6.

Figure 5:
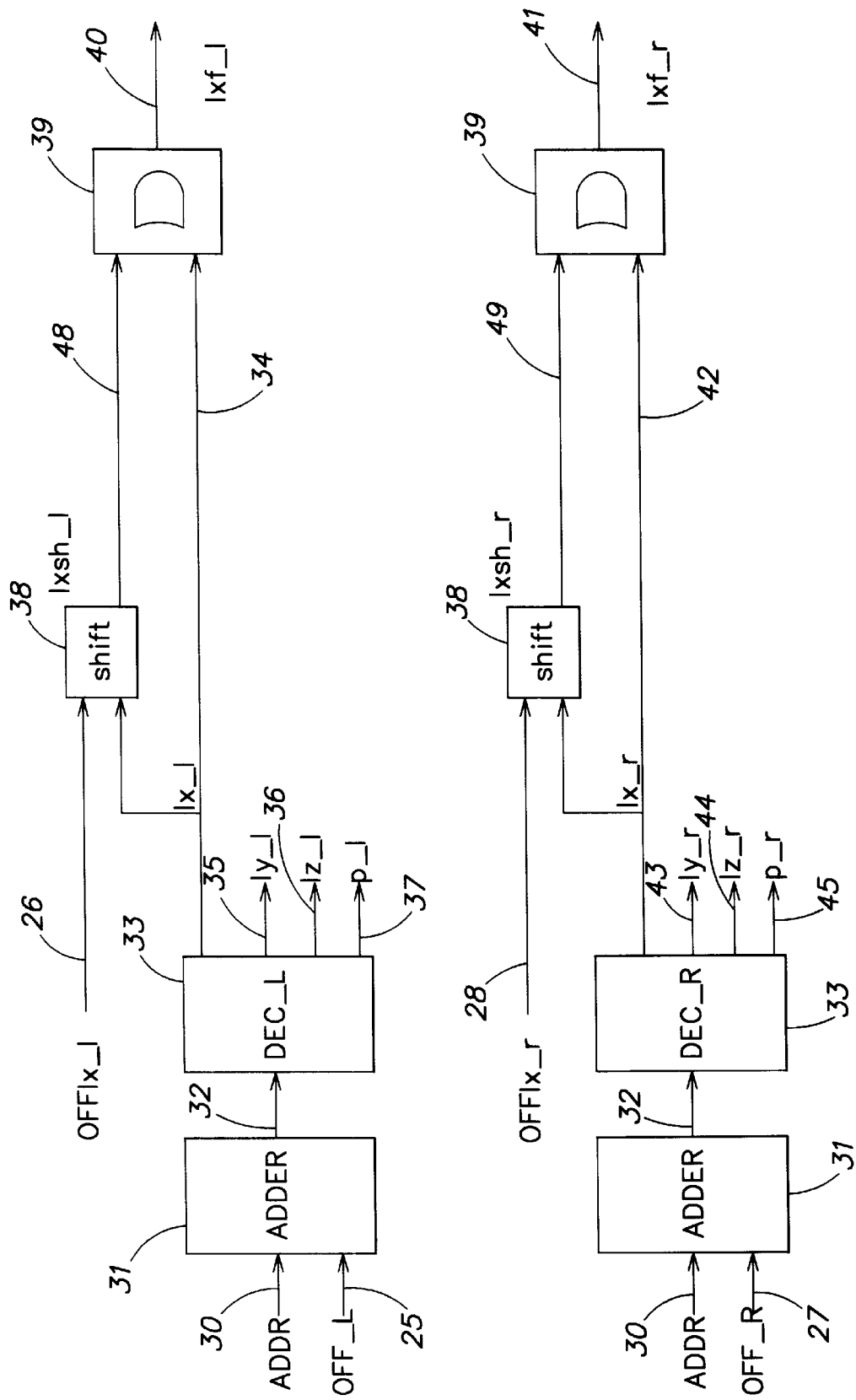
FIG. 5 illustrates a block diagram of a row decoding circuit that is comprised in the erasing and rewriting circuit according to the invention.

In FIG. 5 a row decoding block diagram according to the present invention is illustrated.

According to that illustrated in such figure, it is possible to observe that the bits of the line 30, called ADDR, representing the addresses of the rows of a sub-matrix, are added to the bits of the line 25 which represent the shift of the row address, through the adder block 31.

The block 31, owing to the value of the line 25, allows modification of the original address of the row to be selected, that is the address contained in the line 30, in such a way that it is possible to direct the value contained in said row 25 to a row of the distant sub-matrix.

In this way it is possible, for instance, to select the n row of the sub-matrix 2 or the n row plus the value contained in the line 25 of the same sub-matrix 2 or the n row plus the value contained in the line 27 of the sub-matrix 3.

The output line 32 of said adder block represents the input line of the block 33. This block 33 carries out the decoding operation and generates the signals 1x_1 34, 1y_1 35, 1z_1 36 and p_1 37, which represent the signals that are useful to select a physical sector of the matrix.

In addition, a shifted version of the signal 1x_1 is created through the block 38. Said blocks operate according to the numerical value of line 26 and to the value of line 34.

The value of line 26 allows to select two signals 34 simultaneously, that is if OFF1x_1 has not a null value it is possible that two different sectors are simultaneously enabled.

Then an OR logic is carried out, through the block 39, for each signal of the line 34 with the corresponding signal of the output line 48 of the block 38, called 1xsh_1. As a consequence, if the value of OFF1x_1 is not null, two signals, among those that form the output line 40 of said block 39, will be high, otherwise only one of them will be so.

With equal methodology one proceeds also for the other parts of the memory matrix, by creating a signal 41.

The circuit thus implemented allows carrying out the erasing operation of a row and the programming operation of another row simultaneously, that is it allows carrying out a pipeline operation. This functionality can be realised in two alternative ways that do not mutually exclude each other:

The first way allows enabling, while erasing, for instance a row of the sub-matrix 3, also the decoding of the left side, that is to enable the sub-matrix 2, by supplying it with a programming voltage instead of with an erasing one. The remaining bits are used to carry out the column decoding of the left side by selecting the cell/cells to be programmed.

If one supposes, for instance, to begin to erase a row of the sub-matrix 2, in the following stage it will be possible to program it, by carrying out the erasing operation on the same row of the sub-matrix 3 simultaneously. In the stage that follows, the programming operation of the row of the sub-matrix 3 is carried out but this time the row to be erased in the sub-matrix 2 is the next one. The remaining bits which form the column address are used to control the column decoding of the sub-matrix 3, by selecting simultaneously the cell/cells to be programmed.

The second way allows to simultaneously select two rows of a same sub-matrix with the condition that said rows belong to different sub-sectors of a sub-matrix, by separately supplying the corresponding buffers in order to have the erasing voltage in one row, the programming voltage in the other, while using at the same time the remaining bits to select the column/columns of interest. The local column switches are useful so as to leave the drain electrodes of the row to be erased floating and to connect the drain electrodes of the row to be programmed.

If one erases, for instance, the row 1 of a sector of the sub-matrix 2 and subsequently starts to program it, simultaneously executing the erasing operation of the row 1 of another sector of the same sub-matrix 2, in the following stage this latter row will be programmed but the erasing operation of the row 2 of the initial sector will be carried out.

In both cases the circuits that pilot the bulk and source electrodes of the two rows must be able to apply the erasing and programming voltages to the appropriate sectors.

Further specifying the sequence of the various operations it is possible to notice that, when the process begins and through the addressing bits it is possible to recognise which is the first row to be programmed, for instance a row belonging to the sub-matrix 2, simultaneously the erasing operation of said row starts. The erasing operation requires a determined time in order to be carried out.

Once the erasing operation of said row is finished, the programming of said row starts and simultaneously the erasing operation of a second row is begun. This second row is either in the sub-matrix 3 or in a block different from the previous one of the sub-matrix 2.

During the elapsed time in order to perform the programming operation of the first row, if the erasing operation of the second row is finished, the programming operation of said second row can be started immediately, otherwise one can wait until the execution of the erasing operation of said second row is completed. During the programming operation of said second row the erasing operation of the row next to the first row begins.

The chain process of the various operations goes on until the completion of the programming operation of the two sub-sectors.

Therefore after an initial delay time, called latency, due to the time necessary to effect the erasing operation of the first row, the process continues with the execution of the various operations at a constant speed. The optimal case is obtained if the speed of execution of the erasing operation is equal to the maximum speed of the programming operation, since the programming operation of the sub-sectors proceeds without interruptions, at the same time as the erasing operation.

In the case in which it is necessary to wait until the completion of the erasing operation of a sub-sector there will be dead times.

In both situations the average time necessary to carry out the programming operation of a sub-sector is given by the average time that is necessary to perform the erasing operation of another sub-sector. However the advantage obtained through performing a pipeline operation as compared with the case in which the programming and erasing operations are done at different moments is evident.

In addition it can be noticed that the time necessary to carry out the erasing operation is practically independent from the size of the row, therefore it is possible to provide the same row with a number of columns so that the time necessary to carry out the erasing operation, that is not modified, becomes exactly equal to the time necessary to effect the programming operation, that is instead increased.

Figure 6:
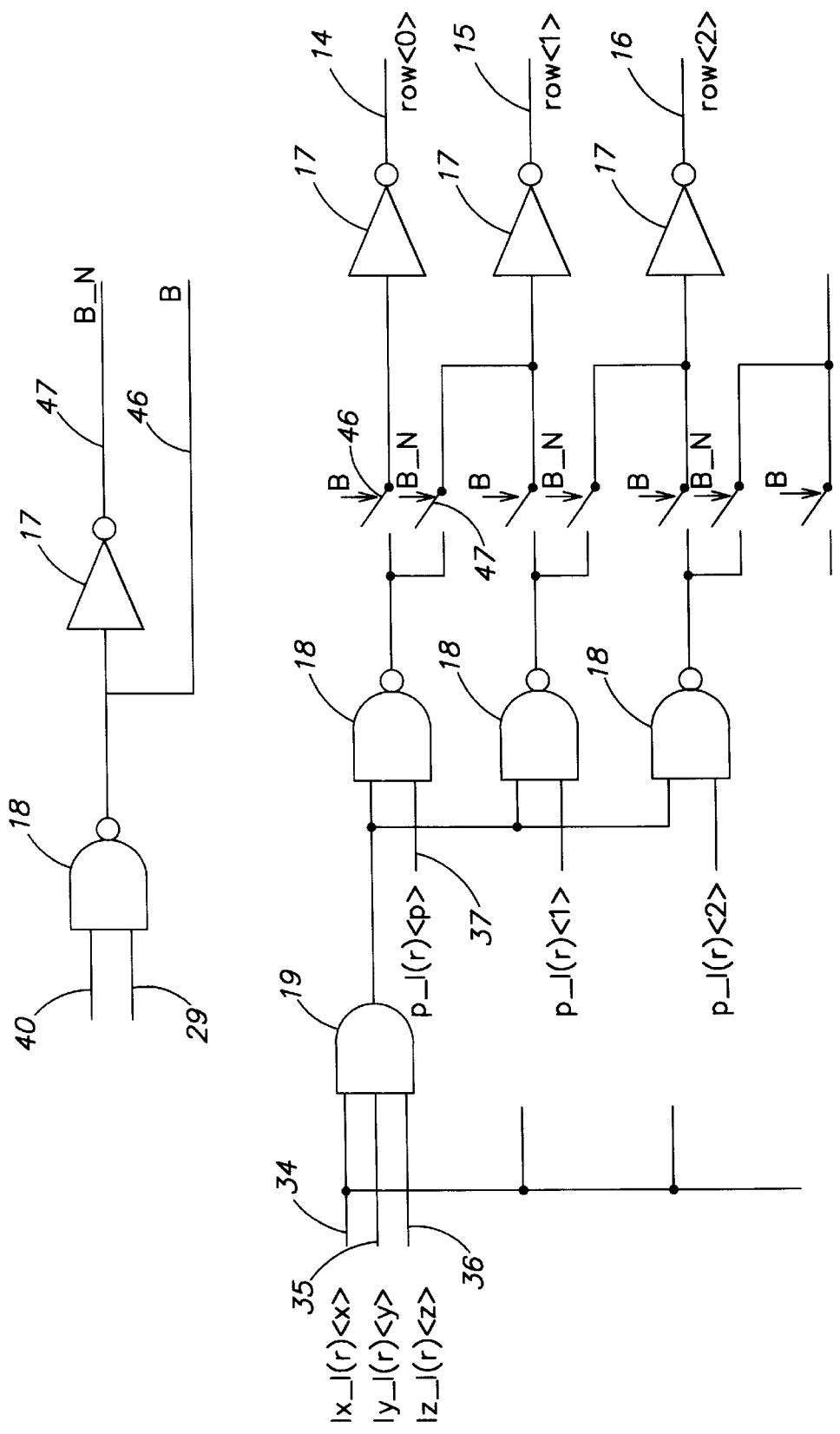
FIG. 6 shows a row selection circuit according to the invention.

In FIG. 6 there is shown the row selection circuit according to the invention.

According to that illustrated in such figure it can be noticed that the signals that are delivered by the decoding circuit of FIG. 5, that is signals 40 and 41, are input in a row address scheme similar to the one shown in FIG. 3.

In addition it is possible to notice that before the logic gates 17 there is a system of switches controlled by the signals 46, named B, and 47, named B_N.

If line 40 and/or line 29 are low, as a result line 46 will be high and said line 46 will close the inverters 17 controlled thereby, while line 47 will be low and said line 47 will keep the inverters controlled thereby open. In this case the function of the row selection circuit illustrated in this figure is identical to the function of the circuit illustrated in FIG. 3.

If line 40 and line 29 are high, as a result line 46 will be low and line 47 will be high. In this way, for instance, it is possible to carry out the programming operation of the n row of the block 100 of the sub-matrix 2 and to carry out the erasing operation of the row n+1 of the block 101 of the sub-matrix 2.

Through the sequence of operations previously described in FIG. 5, this circuit is capable to select two sub-sectors belonging to a sub-matrix 2 or 3, by applying the voltages to carry out the erasing operation to a sub-sector and to apply the voltages to effect the programming operation to the other sector.

As for what concerns the columns of the selected blocks it is necessary to pilot the local switches already implemented in the circuit of selection, in order to keep the drain electrodes of the row that must be subjected to erasing floating and to connect the drain electrodes of the rows that must be subjected to programming.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Circuit for erasing and rewriting blocks of memory cells, particularly analog flash cells, comprising at least one row decoding circuit comprising at least two adder blocks, suitable to generate a row address signal, at least two decoder blocks, suitable to generate respective pluralities of signals identifying a respective sector of memory to be enabled, at least two shifter blocks, suitable to generate an address signal of another row to be enabled, at least two OR logic blocks, suitable to generate respective signals serving the purpose to simultaneously enable at least two rows of the memory matrix.

2. Circuit according to the claim 1, wherein said memory matrix includes a first sub-matrix and a second sub-matrix and each of said at least two OR blocks generates said respective signal to enable at least two rows in the first sub-matrix that are separated by at least two rows of the second sub-matrix, simultaneously.

3. Circuit according to the claim 1, wherein each of said at least two adder blocks has one input for receiving an address of the row to be enabled and another input for receiving a shift signal suitable to identify a respective sector of memory to be enabled.

4. Circuit according to the claim 1, wherein said at least two decoder blocks have as an input signal said row address to be enabled.

5. Circuit according to the claim 1, wherein said at least two shifter blocks each have as input signals a signal with higher hierarchical degree among said signals identifying the sector of memory to be enabled and a shift signal, and as an output a shifted version of said signal with higher hierarchical degree.

6. Circuit according to the claim 5, wherein said at least two OR logic blocks have as input signals the signal with higher hierarchical degree among said signals identifying the memory sector to be enabled and said shifted version of said signal with higher hierarchical degree.

7. Method for parallel erasing and rewriting blocks of memory cells in a memory matrix particularly analog flash cells, comprising the steps of:

(a) through addressing bits of a row it is found which one is the n-th row an of one of the blocks making up one of two sub-matrices of the memory matrix that is to be erased;

(b) once the erasing operation of said n-th row is finished the programming operation of said n-th row begins and simultaneously the erasing operation of another j-th row is begun, where j=n, of another one of the said blocks of the memory matrix that had not been previously selected;

(c) once the erasing operation of said j-th row is finished the programming operation of said j-th row begins and simultaneously the erasing operation of the n+1 row of the said one of the blocks is begun;

(d) the process proceeds until the completion of the programming operation of the whole portion of the memory matrix.

8. Method according to the claim 7 that provides for the following sequences of steps:

(a) through the bits of the row it is found which one is the n-th row of one of the blocks making up one of the two sub-matrixes to be erased;

(b) once the erasing operation of said n-th row is finished, the programming operation of said n-th row begins and simultaneously the erasing operation of a j-th row, belonging to a block separate from the previously selected one of the same previously selected sub-matrix, is begun;

(c) once the erasing operation of said j-th row is finished, the programming operation of said j-th row begins and simultaneously the erasing operation of the n+1 row of the one of the selected block is begun;

(d) the process proceeds until the completion of the programming operation of the blocks of the selected portion of memory.

9. A circuit for erasing and rewriting blocks of memory cells of a memory matrix comprising at least one row decoding circuit that is comprised of, at least two adder blocks for providing respective row address signals, at least two decoder blocks receiving said respective row address signals and providing respective decoded address signals identifying respective sectors of the memory matrix to be enabled, at least two shifter blocks for providing respective address signals of another row to be enabled, and at least two OR logic blocks coupled respectively from said decoder blocks and shifter blocks and for providing respective signals that simultaneously enable at least two different rows of the memory matrix.

10. A circuit according to claim 9 wherein said memory matrix includes a first sub-matrix and a second sub-matrix and said respective signals from said OR blocks simultaneously enable respective rows of said first and second sub-matrices.

11. A circuit according to claim 9, wherein each of said at least two adder blocks has one input for receiving an address of the row to be enabled and another input for receiving a shift signal suitable to identify a respective sector of memory to be enabled.

12. A circuit according to the claim 9, wherein said at least two decoder blocks have as an input signal said row address to be enabled.

13. A circuit according to the claim 9, wherein said at least two shifter blocks each have as input signals a signal with higher hierarchical degree among said signals identifying the sector of memory to be enabled and a shift signal, and as an output a shifted version of said signal with higher hierarchical degree.

14. A circuit according to the claim 13, wherein said at least two OR logic blocks have as input signals the signal with higher hierarchical degree among said signals identifying the memory sector to be enabled and said shifted version of said signal with higher hierarchical degree.

15. A circuit according to the claim 9, wherein said memory matrix includes several sub-sectors and said respective signals from said OR blocks simultaneously enable respective rows of said sub-sectors.

16. Method for erasing and rewriting blocks of memory cells in a memory matrix, comprising the steps of:

(a) determining from addressing signals of a row which one is the n-th row of one of the blocks that is to be erased;

(b) after the erasing step (a), commencing the programming operation of said n-th row and simultaneously initiating the erasing operation of another j-th row of another block of the memory matrix not previously selected;

(c) after the erasing step of step (b), commencing the programming operation of said j-th row and simultaneously initiating the erasing operation of the n+1-th row of said one of the blocks; and (d) proceeding until the completion of the programming operation of the memory matrix.

17. Method according to claim 16, wherein n=j.

18. Method according to claim 16, wherein said memory matrix includes a first sub-matrix and a second sub-matrix, and wherein in step (b) the programming operation is in a row of the first sub-matrix, and the erasing operation is in a row of the second sub-matrix.

19. Method according to claim 16, wherein said memory matrix includes a first sub-matrix and a second sub-matrix, and wherein in step (b) the programming operation is in a row of said one block, and the erasing operation is in a row of said another block, and said one and another blocks are in the same sub-matrix.

* * * * *